US006458239B1

(12) United States Patent
Bhardwaj et al.

(10) Patent No.: US 6,458,239 B1
(45) Date of Patent: Oct. 1, 2002

(54) PLASMA PROCESSING APPARATUS

(75) Inventors: Jyoti Kiron Bhardwaj, Bristol; Leslie Michael Lea, Didcot, both of (GB)

(73) Assignee: Surface Technology Systems plc, Gwent (GB)

( * ) Notice: Subject to any disclaimer, the term of this patent is extended or adjusted under 35 U.S.C. 154(b) by 0 days.

(21) Appl. No.: 09/142,542

(22) PCT Filed: Sep. 22, 1997

(86) PCT No.: PCT/GB97/02543

§ 371 (c)(1),
(2), (4) Date: Sep. 10, 1998

(87) PCT Pub. No.: WO98/13856

PCT Pub. Date: Apr. 2, 1998

(30) Foreign Application Priority Data

Sep. 27, 1996 (GB) .............................................. 9620151

(51) Int. Cl.⁷ ............................ H05H 1/00; C23C 16/00
(52) U.S. Cl. ........................... 156/345.24; 156/345.48; 156/345.51; 118/712; 118/723 I; 118/728
(58) Field of Search ................... 156/345.24, 345.48, 156/345.51; 118/723 I, 723 MP, 715, 712, 725

(56) References Cited

U.S. PATENT DOCUMENTS

| 4,316,791 A | * | 2/1982 | Taillet | 204/298 |
|---|---|---|---|---|
| 5,167,748 A | * | 12/1992 | Hall | 156/345 |
| 5,451,784 A | * | 9/1995 | Loewenhardt et al. | 250/305 |
| 5,529,657 A | | 6/1996 | Ishii | |
| 5,618,350 A | * | 4/1997 | Ishikawa et al. | 118/725 |
| 5,653,811 A | * | 8/1997 | Chan | 118/723 I |
| 5,830,277 A | * | 11/1998 | Johnsgard et al. | 118/725 |
| 5,885,402 A | * | 3/1999 | Esquilbel | 156/345 |

FOREIGN PATENT DOCUMENTS

| EP | 0459177 A2 | 12/1991 | |
| EP | 0651427 A | 5/1995 | |
| JP | 4-74863 A | * 3/1992 | .......... C23C/14/54 |
| JP | 08078191 A | 3/1996 | |
| WO | WO 97/04478 A | 2/1997 | |

OTHER PUBLICATIONS

Patent Abstracts of Japan, vol. 095, No. 006, Jul. 31, 1995 & JP 07 086179 A (Hitachi Ltd), Mar. 31, 1995, see abstract.

* cited by examiner

Primary Examiner—Gregory Mills
Assistant Examiner—P. Hassanzadeh
(74) Attorney, Agent, or Firm—Volentine Francos, PLLC

(57) ABSTRACT

A plurality of antennae generate a plasma in the chamber containing a workpiece, and the relative outputs of the antennae are varied as a detector detects a property or parameter of the resultant plasma or process. The relative outputs of the antennae are controlled in accordance with the property or parameter detected. The detector, which detects the property or parameter at or near the workpiece location, is a Langmuir probe which is shielded from the plasma by a semiconductor or insulating layer and is driven.

17 Claims, 5 Drawing Sheets

PLASMA PROCESSING APPARATUS

This invention relates to plasma processing apparatus and methods.

Plasma processing apparatus is used in many stages of the fabrication of semiconductor devices such as in etching and deposition. As the scale size of features on these devices is reduced and the overall size of the wafers is increased, there is a need for increased plasma density and uniformity over ever-greater areas. In a related field plasma is used as a source of ion or electrons for an accelerator of these particles, which are then used for a variety of physical processes. The spatial uniformity of the extracted beam is related to the uniformity of the plasma in the source of charged particles. For the purposes of this Specification the creation of a plasma to provide a source of such particles is included in the term "plasma processing".

Current practice is to attempt to determine, whether theoretically or empirically, the output which will be provided by an antenna used to generate a plasma in the chamber and then to alter the physical construction and location of the antenna and chamber so as to produce as uniform a plasma as possible. However successful these calculations are, they tend to only relate to one set of operating conditions, whilst a user would expect to be able to perform a variety of processes within a chamber which may use a variety of reactive gases.

From one aspect the invention consists in plasma processing apparatus for processing a workpiece comprising a processing chamber for receiving the workpiece at a location, a plurality of antennae for generating a plasma in the chamber, means for varying the relative outputs of the antennae, detecting means for detecting a property or parameter of the resultant plasma or process and control means for controlling the output varying means in accordance with the property or parameter detected.

For the purposes of this Specification the term "antenna" includes a coil or other device which is suitable for generating a plasma. It is particularly preferred that the antennae should inductively couple power to the plasma once it is initiated. The apparatus and the method of this Application are particularly suitable for use with RF driven antennae.

The detecting means includes a detector within the chamber. The detector may detect ion flux, ion energy and/or neutral particle arrival or removal rates. Indeed any property or parameter which reflects either the intensity and/or distribution of the plasma or the rate of the process being operated can be used as the basis of detection.

It is particularly preferred that the property or parameter is detected at or near the workpiece location. For example, the detector may be in the a form of Langmuir probe. It is particularly preferred that the Langmuir probe is shielded from the plasma by a semi-conductor or insulating layer, which may have a thickness in the range of a few times the Debye length of the plasma, typically 50–100 $\mu$m. In general, in order to operate, the layer will have to be thin. In these arrangements the Langmuir probe is driven. For example the probe may receive intermittent RF power and the ion flux may be detected in the periods when the power is switched off by detecting the rate of discharge of a series capacitor.

The probe may be mounted in a semiconductor or insulator with a thin layer of material separating the probe from the plasma.

In the above arrangements the detector may be mounted in a semiconductor wafer so that such a wafer can be placed in a processing chamber on a support to enable a chamber to be set up for any particular process. Alternatively, and in most cases more conveniently, a detector may be located in a wafer support platen within a chamber.

Alternatively the detector may detect the properties of the plasma indirectly by monitoring the condition of the workpiece. For example, etch depth could be measured using a remote interferometer.

The detecting means may include a plurality of detectors and there may be one or more detectors associated with each antenna. The detector or detectors may detect a number of properties. The control means may control the output of each antenna in response to its associated detector or in response to the output of its detector relative to the output of at least one other detector.

The means for varying the relative outputs of the antennae may include means for varying the magnitude, frequency, or relative phase of power fed to the antennae and/or the relative position of the antennae. The objective will usually be to achieve increased homogeneity but specific inhomogeneous conditions may be maintained.

From another aspect the invention consists in a workpiece or a workpiece support including a Langmuir probe embedded therein such that the probe is covered by a layer of semiconductor or insulator.

Preferably there are a plurality of probes and the wafer or support may further include means for intermittently feeding RF power to the probes and means for monitoring the discharge of a capacitor in series with each probe whilst the RF supply is switched off.

From a still further aspect the invention consists in a method of performing a plasma process including generally the plasma in a chamber by means of a plurality of antennae, detecting or setting a property or parameter of resultant plasma or process and controlling the relative outputs of the antennae in accordance with the property or parameter detected.

Preferably there is one or more detectors associated with each antenna and the antenna is controlled on the basis of the plasma or process detected by the associated detector or detectors. Each antenna may further be controlled on the basis of the magnitude of the property or parameter detected by its associated detector relative to the corresponding magnitude for at least one other detector. More than one property or parameter may be detected.

The outputs of the antennae may be controlled by varying the magnitude frequency or relative phase of the power fed to the antenna and/or the physical position of the antennae.

The process may be performed on a workpiece and the parameter or property may be detected at or adjacent the level of the workpiece.

Although the invention has been defined above it is to be understood it includes any inventive combination of the features set out above or in the following description.

The invention may be performed in various ways and a specific embodiment will now be described by way of example with reference to the accompanying drawings, in which.

Figure 1:
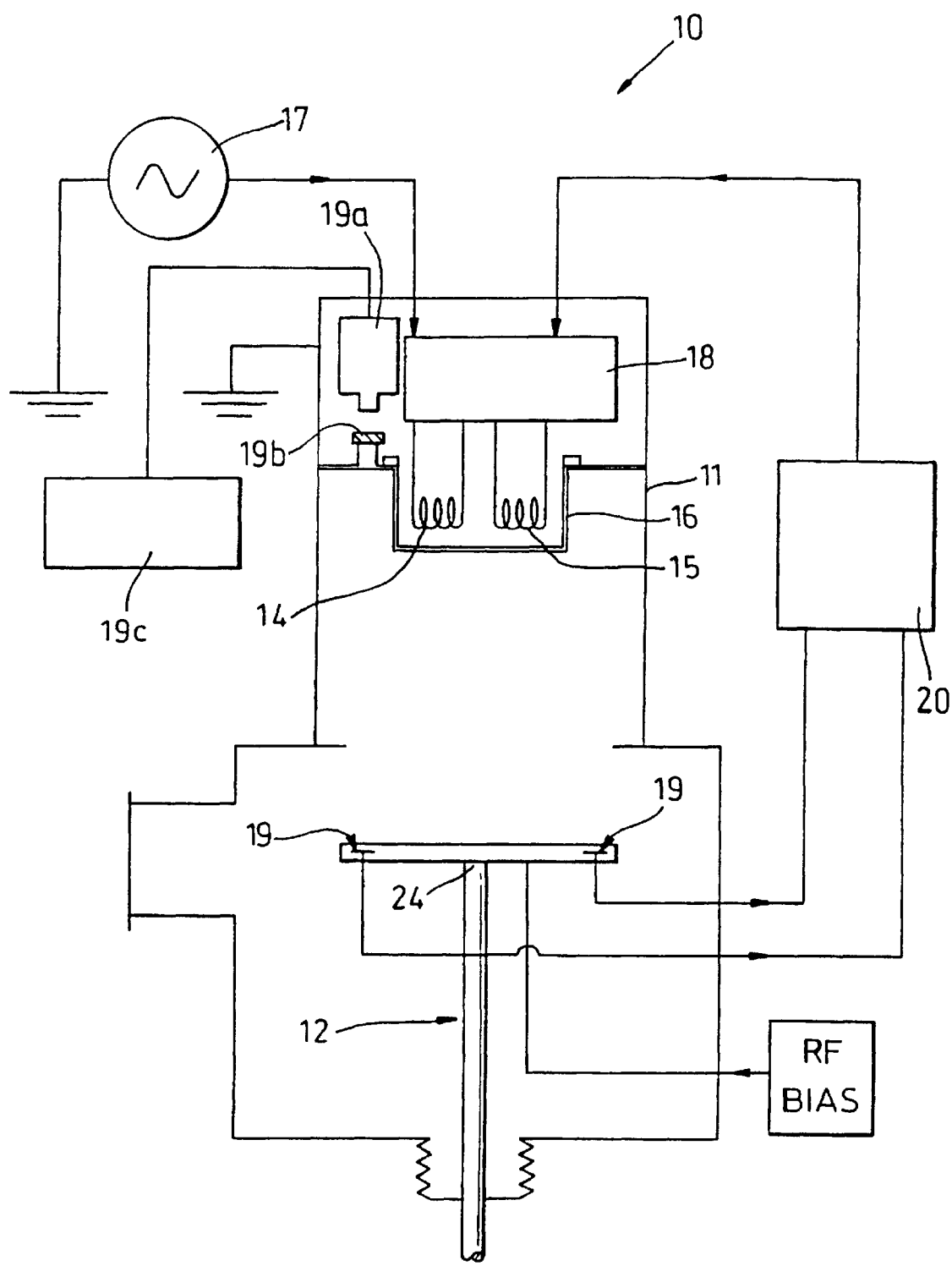
FIG. 1 is a schematic diagram of a processing apparatus.

FIG. 1, shows a plasma processing system 10 in cross-sectional view. It includes a wafer processing chamber 11 and the means 12 by which a wafer is supported and moved to the appropriate level for processing. The processing chamber 11 is generally a metal container of circular or rectangular cross-section, although other multi-sided forms are possible. One or more ports (not shown) will exist to permit gas to be admitted and possibly diagnostics. In FIG. 1, coils 14, 15 are located outside of a re-entrant section 16 of the chamber, which is constructed out of a dielectric material. This is intended to demonstrate a possible configuration and does not preclude alternative arrangements of coils separated from the plasma by dielectric material. In practice any suitable number of coils may be used.

In order to improve the confinement of the plasma within the chamber 11 and therefore increase the plasma density, magnets (not shown) may be located in particular orientations around the walls and/or top of the chamber 11. The use of small permanent magnets for this purpose is well known.

Under normal operating conditions a high vacuum is maintained within the chamber 11, which necessitates that the dielectric section 16 is appropriately sealed to the main structure of the chamber 11.

The coils 14, 15, which couple radio frequency power into a plasma generated by them in the chamber 11, are located close to the surface of the dielectric section 16 in order to produce an efficient transformer action into the plasma. They may be wound in a number of forms and may include planar sections.

Radio frequency power is provided by a supply 17, and then fed to the coils 14, 15, via an impedance matching unit 18. Signals from the detectors 19 (which are described in more detail below) within the chamber 11 are fed to a control module 20, where they are processed. From these processed detector signals, the control module 20 outputs control signals which directly control an element of the matching unit 18 relating to each coil and hence the power dissipated in the plasma due to each particular coil. A common matching stage matches the combined impedance of the coils and tuning circuitry to the radio frequency generator.

Although the detectors may be located at a variety of positions, it is particularly preferred that they are at or adjacent the level at which the wafer is processed.

In addition to, or as alternative for, the detectors 19 and interferometer head 19a may be provided to "view" an area of the workpiece through a window 19b. An interferometer control unit 19c is provided which can generate a signal to the feedback control module 20. The interferometer head 19a may be moveable so as to monitor spacial variations or more than one head may be provided.

Figure 2:
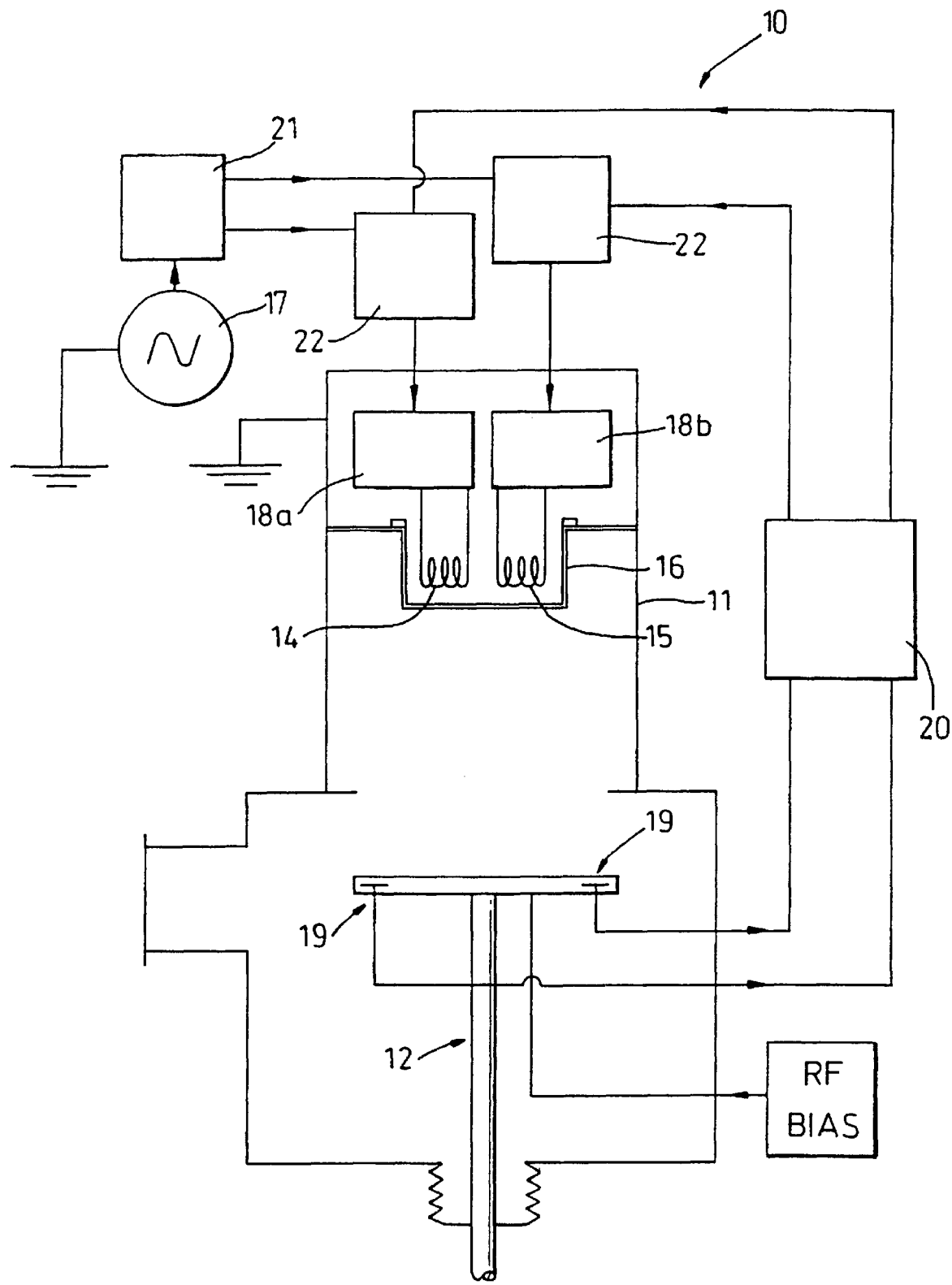
FIG. 2 is a corresponding diagram of an alternative embodiment.

In FIG. 2, the plasma processing chamber remains as shown in FIG. 1, but with an alternative system for controlling the supply of radio frequency power to the coils. Radio frequency power produced by power supply 17 is now split, either equally or unequally, and fed to separate impedance matching units 18a and 18b. Variation of the split fraction may provide the control of the power fed to the coils. Alternatively separate power supplies may be used with separate impedance matching systems or, as has been mentioned above, the location of one or more coils may be changed.

Radio frequency power from the supply 17, is fed to the splitter unit 21. Each output from this unit 21 then passes through an attenuator/amplifier 22, with action controlled by the control module 20 which is responsive to detectors 19. The output from each attenuator/amplifier 22 then passes through the appropriate impedance matching unit 18a, 18b to the respective coil 14, 15.

Figure 3A:
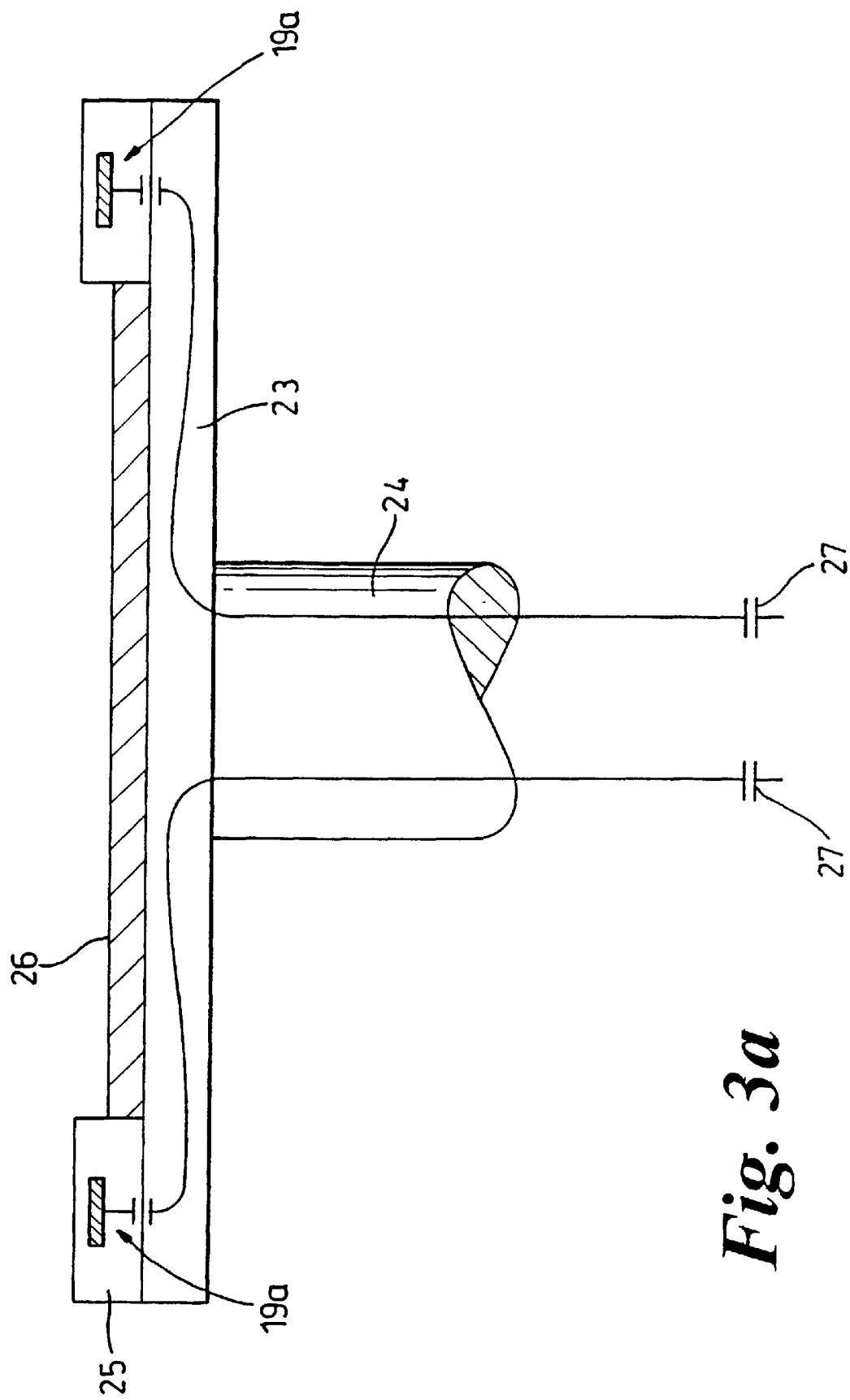
FIGS. 3a and 3b are enlarged sectional views of a platen for use in the apparatus of FIG. 1 or FIG. 2, the former being suitable for a single wafer whilst the latter is suitable for a batch of wafers.
Figure 3B:
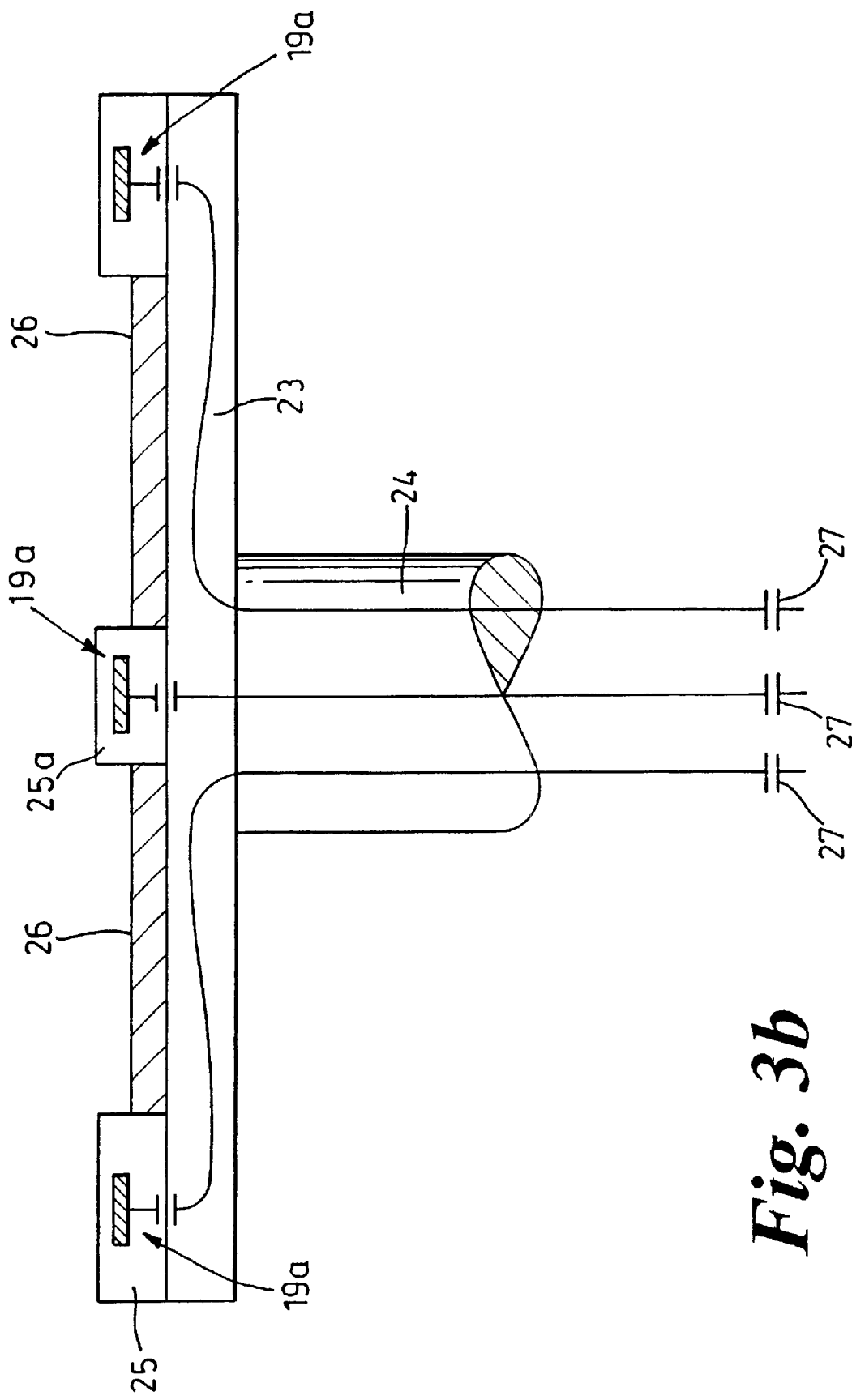

FIG. 3, shows a type of diagnostic probe or detector 19a which may be used to measure the spatial uniformity of the positive ion flux, and details how each probe may be incorporated in the platen which carries the silicon wafers for processing. No detail is given of the surface of the platen relating to how the wafers are clamped in place, or how they may be heated or cooled as appropriate. The particular form of detector 19 shown here, is described in some detail. Detectors to measure other plasma properties or parameters or processing rates, such as ion energy analysers, or those to measure neutral particle arrival or removal rates (such as piezoelectric crystal based designs) or those to directly measure processing rates (eg. laser interferometry) may also be used to provide the diagnostic input in the control loop.

FIG. 3 shows the main part 23 of the platen 24 of the wafer support. The part 23 may be at least partly metallic. Radio frequency power is supplied to all or part of the support 12 in order to create the negative dc bias on the wafers when it is necessary to accelerate ions to them. A non-reactive insulating disc 25, surrounds the wafer 26, when it is in position on the platen. If a batch of wafers is being processed a central insulating locating hub 25a can be provided (see FIG. 3a).

The detectors 19 detailed in FIG. 3 are small planar Langmuir probes 19a which are mounted within the insulator 25, so that only a very small thickness of insulator separates them from the plasma or the process particles. If present hub 25a may also include a detector 19. Conventional Langmuir probes are small metallic electrodes which when inserted into a plasma and biassed with a dc voltage relative to the plasma, allow measurements to be made from which the electron and ion densities and the electron temperature can be obtained. When plasma processing of semiconductors is taking place there are two potential problems with conventional Langmuir probes, the first is that material may be removed from the surface of a probe and redeposited on a wafer causing contamination, and second, the Langmuir probe may be coated with an insulating layer which prevents ions and electrons reaching it. For plasma enhanced chemical vapour deposition or physical vapour depositions, the support 12 may be grounded or biased and the detector 19 may be on other driven or grounded surfaces within the processing chamber. Different applications may required different forms of probes.

The technique used here is based on the realisation that if a radio frequency voltage is applied to a probe mounted on the wall of a chamber or near the grounded electrode of a capacitively coupled plasma source, then it is possible to measure the positive ion flux even though a layer of insulating material had been deposited on it. This technique is the subject of French Patent Application 95/11181. The present system differs, in that the probe 19a is mounted within an insulator (or semiconductor) which is part of the structure of the driven electrode, and is never directly exposed to the plasma, preventing contamination of said plasma. The probes are driven through individual coupling capacitors 27 from a radio frequency supply which may be the same as used to feed the driven electrode. Provision is made to remove the RF feed to each probe 19a at fixed intervals of time so that the discharge rate of the related series capacitor 27, which is essentially a linear function of the positive ion flux to the probe, can be measured. The electrical path to each probe from the RF supply, via the associated series capacitor, may pass through direct electrical contacts at any required disconnection point, or via a capacitive coupling arrangement which will introduce an additional series capacitance.

Figure 4:
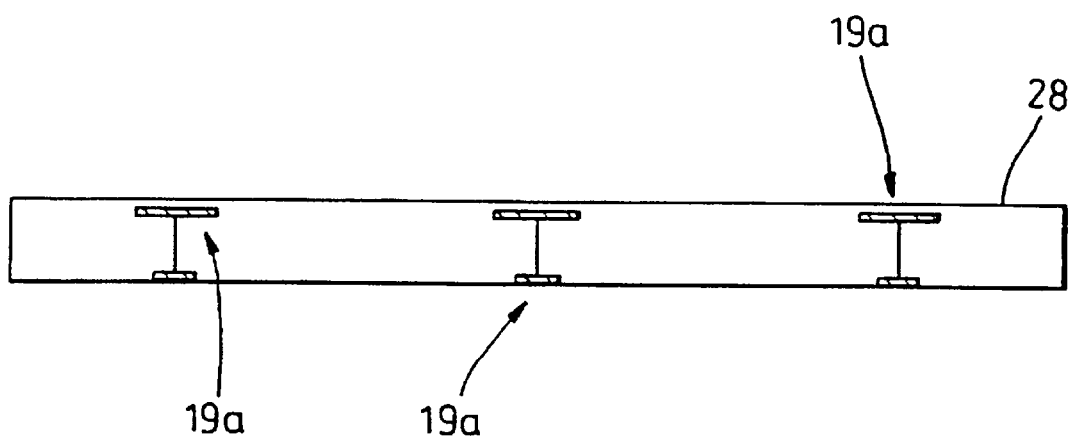
FIG. 4 is a diagrammatic representation of a "smart" wafer for use with the apparatus of FIGS. 1 and 2.

FIG. 4, shows a simplified conceptual design for a "smart" wafer 28 which could be used to measure the variation of plasma or neutral particle properties across its surface using an array of suitable miniaturised diagnostics. In FIG. 4, the wafer incorporates a series of Langmuir probes 19a of the type described in relation to FIG. 3. The signal from each probe is taken by either a capacitive or direct contact connection to the structure below the wafer.

In some applications it may not be practicable to use a "smart" wafer, or diagnostic probes permanently located in the platen. In such cases a suitable system can be installed in a side extension of the processing chamber, or through a suitable side port, to move an array of diagnostic probes or detectors into the chamber. This would allow verification of the spatial uniformity of plasma or process species parameters immediately prior to commencement of the process operation. Continuous feedback control would not be possible with this arrangement, unless there is a direct relationship between the values of the chosen property or parameter measured by additional probes at or in the wall compared to values on the platen. It would, however, be possible to set up the plasma conditions, on the basis of measurements from the moveable diagnostic array, before the commencement of processing and each time that processing conditions were required to be changed.

As mentioned above continuous feedback control could be based on signals provided by additional or alternative wall mounted probes and these may be particularly suitable where the workpiece support electrode is not driven/grounded. Other parameters may be fed into the control system. For example spatial process information, such as provided by laser interferometry may be taken into account within the feedback measurement and control system. Thus the power fed to the plasma may be increased as etched formation became deeper.

It will be understood that the invention is suitable for use with a number of different plasma generation devices such as electron cyclotron resonance or by capacitive coupling R.F. power. All such devices are included within the term "antennae". Further, as has been indicated above the plasma may be an intermediary stage in the generation of neutral particles and the detection of, for example, the flux of these particles constitutes detecting a property of the process.

What is claimed is:

1. Plasma processing apparatus for processing a workpiece, comprising a processing chamber for receiving the workpiece at a location, a plurality of antennae for generating a plasma in the chamber, means for varying the relative outputs of the antennae, a detector for detecting a property or parameter of the resultant plasma or process, and control means for controlling or setting the output varying means in accordance with the property or parameter detected, wherein the detector is a Langmuir probe which is shielded from the plasma by a semiconductor or insulating layer and is driven, and wherein the detector detects the property or parameter at or near the workpiece location.

2. Apparatus as claimed in claim 1 wherein the detector detects ion flux, ion energy and/or neutral particle arrival or removal rates.

3. Apparatus as claimed in claim 1 wherein the probe is mounted in a semiconductor or insulator with a thin layer of material separating the probe from the plasma.

4. Apparatus as claimed in claim 1 wherein the detector is mounted in a workpiece.

5. Apparatus as claimed in claim 4 wherein additionally or alternatively a detector is mounted in the chamber at a location spaced from the workpiece or support.

6. Apparatus as claimed in claim 1 wherein the detector is located in a workpiece support platen within the chamber.

7. Apparatus as claimed in claim 1 wherein the detecting means includes a plurality of detectors.

8. Apparatus as claimed in claim 7 wherein there is at least one detector associated with each antennae.

9. Apparatus as claimed in claim 8 wherein the control means controls the output of each antenna in response to its associated detector or detectors.

10. Apparatus as claimed in claim 1 wherein the means for varying the relative outputs of the antennae includes means for varying the magnitude, frequency or relative phase or power fed to the antennae and/or the relative position of the antennae.

11. Apparatus as claimed in claim 1 wherein the control means is responsive to other process properties or parameters.

12. Apparatus as claimed in claim 11 wherein the other parameter is spatial process information.

13. A charged particle source comprising apparatus as claimed in claim 1 wherein the process is the production of charged particles.

14. A method of performing a plasma process including generating a plasma in a chamber by means of a plurality of antennae, driving a Langmuir probe which is in the chamber and shielded from the plasma to detect at least one property or parameter of the resultant plasma or process at or near the workpiece location, and controlling or setting the relative outputs of the antennae in accordance with the property or parameter detected.

15. A method as claimed in claim 14 wherein there is a Langmuir probe associated with each antenna and the antennae are controlled on the basis of the plasma or process detected by the sociated Langmuir probe.

16. A method as claimed in claim 15 wherein each antenna is further controlled on the basis of the magnitude of the parameter or property detected by its associated detector relative to the corresponding magnitude for at least one other detector.

17. A method as claimed in claim 14 wherein the outputs of the antennae are controlled by varying the magnitude, frequency, or relative phase of the power fed to the antennae and/or the physical position of the antennae.

* * * * *